United States Patent
Yeh et al.

(10) Patent No.: US 8,749,418 B2
(45) Date of Patent: Jun. 10, 2014

(54) INTERPOLATIVE DIGITAL-TO-ANALOG CONVERTER

(71) Applicant: ILI Technology Corporation, Jhubei (TW)

(72) Inventors: Sung-Yau Yeh, Jhubei (TW); Chih-Kang Deng, New Taipei (TW)

(73) Assignee: Ili Technology Corporation, Jhubei, Hsinchu County (TW)

( * ) Notice: Subject to any disclaimer, the term of this patent is extended or adjusted under 35 U.S.C. 154(b) by 0 days.

(21) Appl. No.: 13/764,824

(22) Filed: Feb. 12, 2013

(65) Prior Publication Data

US 2014/0043178 A1 Feb. 13, 2014

(30) Foreign Application Priority Data

Aug. 9, 2012 (TW) .............................. 101128774 A

(51) Int. Cl.
*H03M 1/68* (2006.01)
*H03F 3/45* (2006.01)
*G09G 3/296* (2013.01)
*G09G 3/36* (2006.01)

(52) U.S. Cl.
CPC ............ *H03M 1/682* (2013.01); *H03F 3/45179* (2013.01); *G09G 3/3688* (2013.01)
USPC ............ 341/145; 341/144; 330/261; 345/692

(58) Field of Classification Search
CPC ......... H03M 1/68; H03M 1/76; G09G 3/3688
USPC ............ 341/136, 144, 145, 154; 345/89, 690, 345/691, 692
See application file for complete search history.

(56) References Cited

U.S. PATENT DOCUMENTS

| | | | |
|---|---|---|---|
| 7,015,847 B1 * | 3/2006 | McLachlan et al. | 341/145 |
| 7,368,990 B2 * | 5/2008 | Tsuchi | 341/145 |
| 8,325,075 B2 * | 12/2012 | Kim et al. | 341/145 |
| 2002/0033763 A1 * | 3/2002 | Nakao | 341/154 |
| 2006/0132344 A1 * | 6/2006 | Ishii et al. | 341/144 |
| 2008/0211703 A1 * | 9/2008 | Tsuchi | 341/144 |

* cited by examiner

*Primary Examiner* — Howard Williams
(74) *Attorney, Agent, or Firm* — Nixon & Vanderhye P.C.

(57) ABSTRACT

An interpolative digital-to-analog (D/A) converter is adapted to convert a N-bit digital signal into an analog signal, where N is a positive integer greater than 1. The interpolative D/A converter includes a router unit that outputs first and second router voltages based on the first and second bits of the digital signal, and an interpolation unit that receives the first and second router voltages from the router unit, and that performs interpolation operation on the first and second router voltages according to the first bit of the digital signal, so as to generate the analog signal having a voltage magnitude ranging from the first router voltage to the second router voltage.

9 Claims, 10 Drawing Sheets

INTERPOLATIVE DIGITAL-TO-ANALOG CONVERTER

CROSS-REFERENCE TO RELATED APPLICATION

This application claims priority to Taiwanese Application No. 101128774, filed on Aug. 9, 2012.

BACKGROUND OF THE INVENTION

1. Field of the Invention

The invention relates to a digital-to-analog converter, and more particularly to an interpolative digital-to-analog converter.

2. Description of the Related Art

Referring to FIG. 1, a conventional 6-bit digital-to-analog (D/A) converter 1 is adapted to convert a digital signal D[5:0] into an analog signal Vout. The digital signal D[5:0] has $1^{st}$ to $6^{th}$ bits D[0]~D[5]. The conventional 6-bit D/A converter 1 includes 126 switches 11 and a buffer stage 12, and receives the $1^{st}$ to $6^{th}$ bits D[0]~D[5], and $1^{st}$ to $64^{th}$ reference voltages Vref0~Vref63 having an arithmetic progression relationship in magnitude. The conventional 6-bit D/A converter 1 employs the switches 11 to perform binary-tree decoding based on the $1^{st}$ to $6^{th}$ bits of the digital signal D[0]~D[5] to output one of the $1^{st}$ to $64^{th}$ reference voltages Vref0~Vref63 as the analog signal Vout through the buffer stage 12. In FIG. 1, the switches 11 corresponding to D[*] do not conduct when D[*]=0 and conduct when D[*]=1, while the switches 11 corresponding to $\overline{D[*]}$ do not conduct when D[*]=1 and conduct when D[*]=0. Therefore, Vout=Vref0 when D[5:0]=000000, Vout=Vref1 when D[5:0]=000001, Vout=Vref2 when D[5:0]=000010, . . . , and Vout=Vref63 when D[5:0]=111111.

However, the large number of the switches 11 employed in the conventional 6-bit D/A converter 1 results in complicated routing and requirement of a large layout area.

SUMMARY OF THE INVENTION

Therefore, an object of the present invention is to provide an interpolative digital-to-analog converter that can overcome the above drawbacks of the prior art.

According to the present invention, an interpolative digital-to-analog converter is adapted to convert a digital signal that includes first to $N^{th}$ bits into an analog signal, where N is a positive integer greater than 1. The interpolative digital-to-analog converter comprises:

a first router unit that is adapted to receive the first and second bits of the digital signal, and first and second voltages, and that is operable based on the first and second bits of the digital signal to output one of the first and second voltages to be a first router voltage and to output one of the first and second voltages to be a second router voltage; and an interpolation unit that receives the first bit of the digital signal, that is coupled to the first router unit for receiving the first and second router voltages, and that is operable to perform interpolation operation on the first and second router voltages according to the first bit of the digital signal, so as to generate the analog signal having a voltage magnitude ranging from the first router voltage to the second router voltage.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 2:
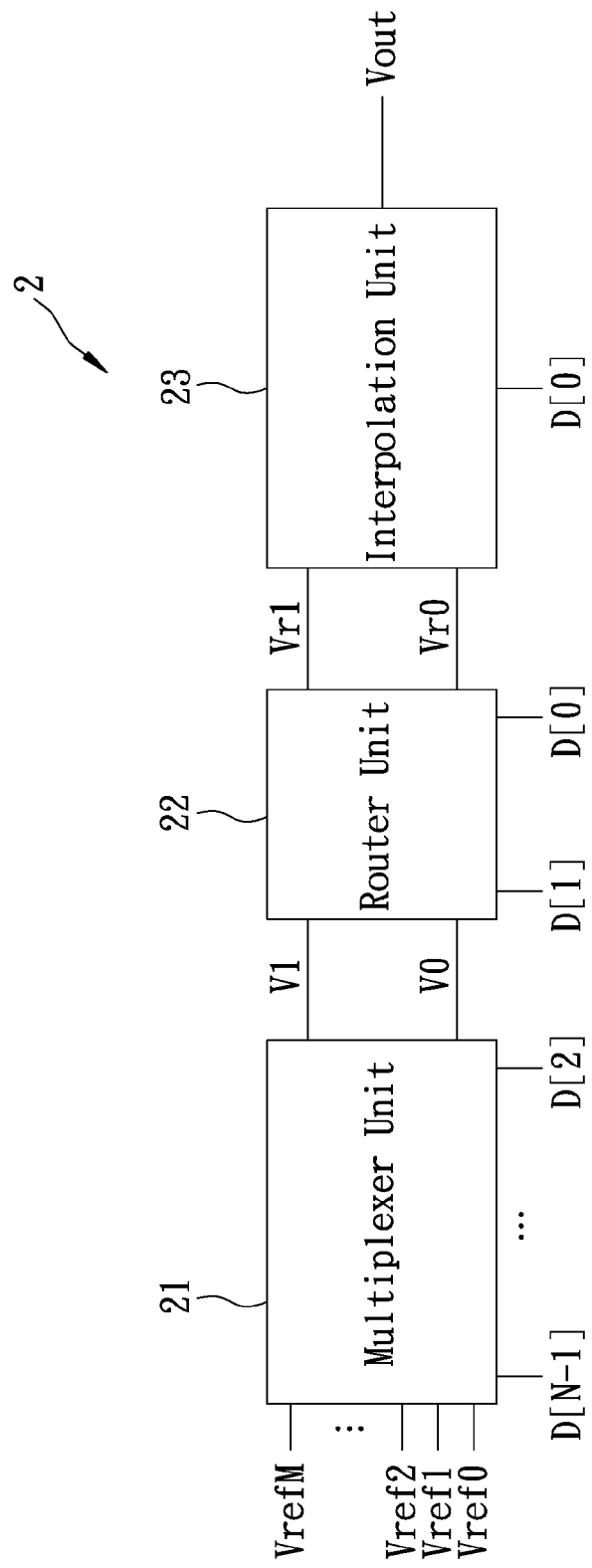
FIG. 2 is a block diagram showing a first preferred embodiment of the interpolative digital-to-analog converter according to the present invention.

Referring to FIG. 2, a first preferred embodiment of the interpolative digital-to-analog (D/A) converter 2 according to this invention is shown to be adapted to convert a digital signal D[N−1:0] that includes $1^{st}$ to $N^{th}$ bits D[0]~D[N−1] into an analog signal Vout, where N is a positive integer greater than 2. The interpolative D/A converter 2 includes a multiplexer unit 21, a router unit 22, and an interpolation unit 23.

The multiplexer unit 21 receives the third to the $N^{th}$ bits of the digital signal D[2]~D[N−1] and first to $(M+1)^{th}$ reference voltages Vref0~VrefM with different magnitudes, and outputs two of the reference voltages Vref0~VrefM as first and second voltages V0, V1, respectively, according to the third to $N^{th}$ bits of the digital signal D[2]~D[N−1]. In this embodiment, the reference voltages Vref0~VrefM have an arithmetic progression relationship in magnitude, and $M=2^{N-2}$.

The router unit 22 is coupled to the multiplexer unit 21 for receiving the first and second voltages V0, V1 therefrom and receives the first and second bits of the digital signal D[0], D[1]. The router unit 22 outputs one of the first and second voltages V0, V1 to be a first router voltage Vr0 and outputs one of the first and second voltages V0, V1 to be a second router voltage Vr1 based on the first and second bits of the digital signal D[0], D[1].

The interpolation unit 23 receives the first bit of the digital signal D[0], and is coupled to the router unit 22 for receiving the first and second router voltages Vr0, Vr1. The interpolation unit 23 performs interpolation operation on the first and second router voltages Vr0, Vr1 according to the first bit of the digital signal D[0], so as to generate the analog signal Vout having a voltage magnitude ranging from the first router voltage Vr0 to the second router voltage Vr1. In some cases, the interpolation result may be zero. That is, in some cases, the analog signal Vout may have a voltage magnitude equal to the first router voltage Vr0 or the second router voltage Vr1.

Figure 3:
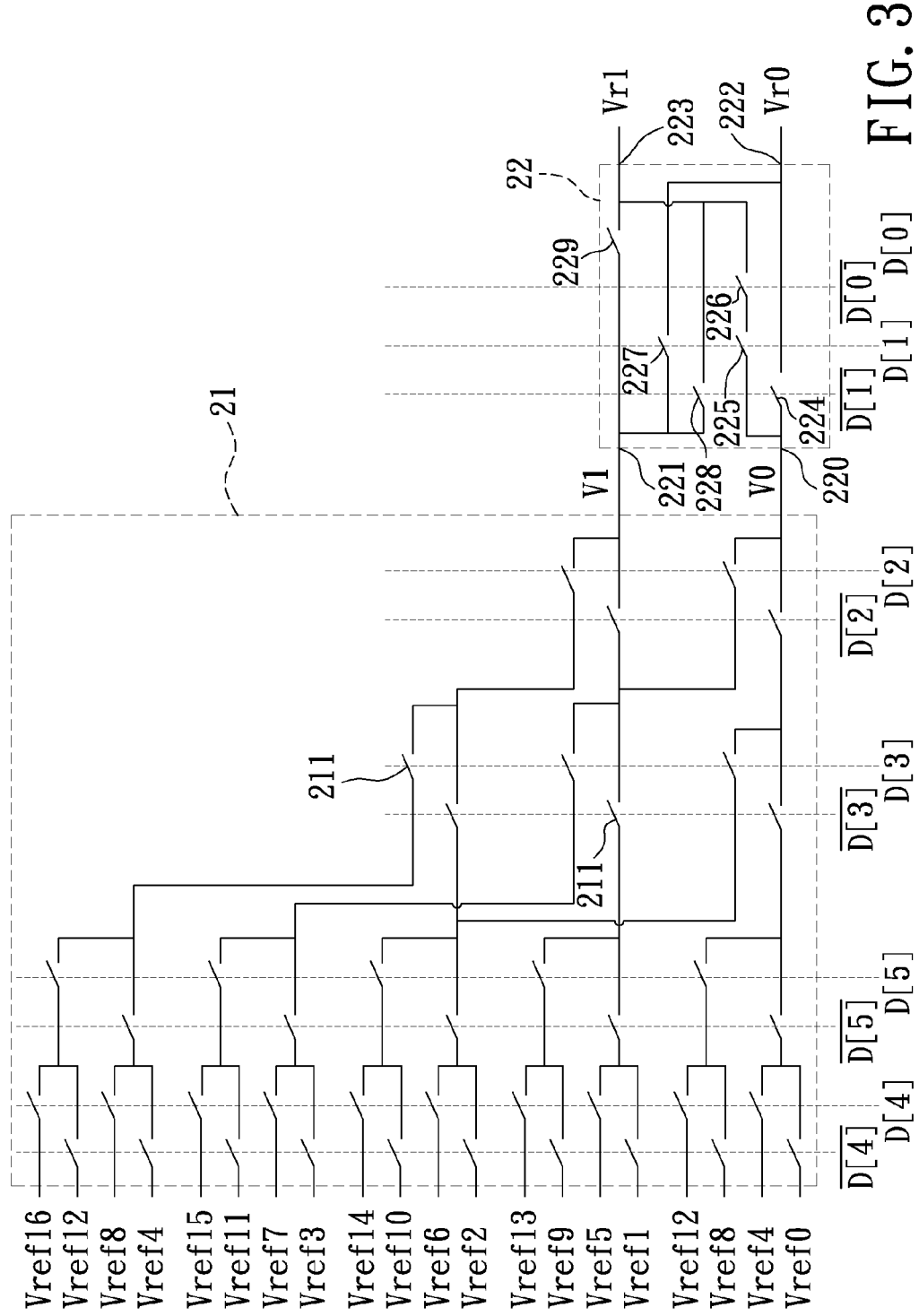
FIG. 3 is a schematic circuit diagram showing a multiplexer unit and a router unit of the first preferred embodiment.
Figure 4:
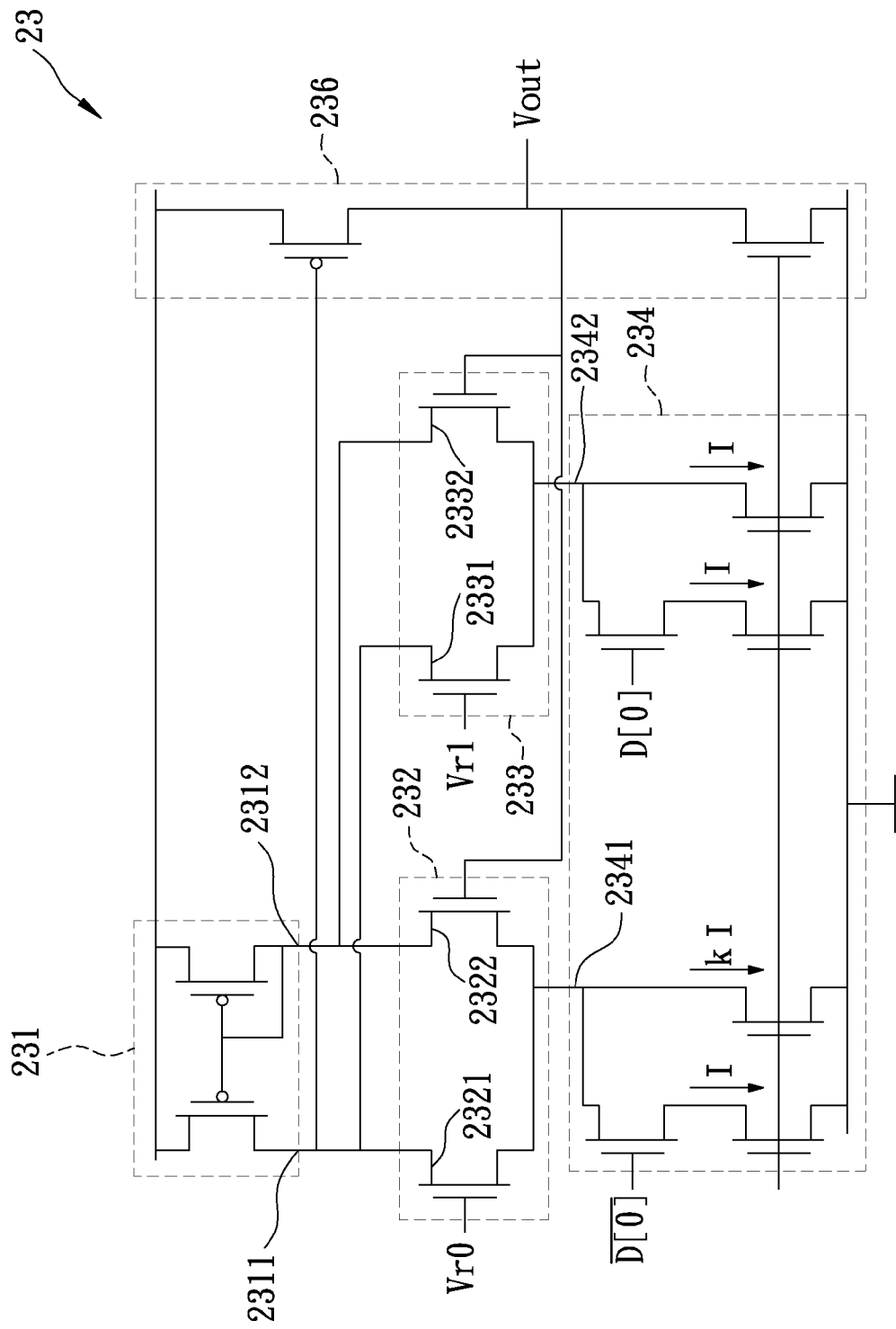
FIG. 4 is a schematic circuit diagram showing a first implementation of an interpolation unit of the first preferred embodiment.

Referring to FIGS. 2, 3, and 4, the following illustrations are exemplified using N=6.

The multiplexer unit 21 includes forty switches 211. In FIG. 3, the switches 211 corresponding to D[*] do not conduct when D[*]=0 (first logic value), and conduct when D[*]=1 (second logic value). The switches 211 corresponding to $\overline{D[*]}$ conduct when D[*]=0, and do not conduct when D[*]=1. Therefore, V0=Vref0 and V1=Vref1 when D[5:2]=0000, V0=Vref1 and V1=Vref2 when D[5:2]=0001, V0=Vref2 and V1=Vref3 when D[5:2]=0010, . . . , V0=Vref15 and V1=Vref16 when D[5:2]=1111, as listed in Table 1.

The router unit 22 includes a first input 220 for receiving the first voltage V0, a second input 221 for receiving the second voltage V1, a first output 222 for outputting the first router voltage Vr0, a second output 223 for outputting the second router voltage Vr1, a first switch 224, a second switch 225, a third switch 226, a fourth switch 227, a fifth switch 228, and a sixth switch 229.

The first switch 224 is coupled to the first input 220 and the first output 222, and is operable to make electrical connection between the first input 220 and the first output 222 when D[1]=0, and to break electrical connection between the first input 220 and the first output 222 when D[1]=1.

The second switch 225 is coupled to the first input 220, and the third switch 226 is coupled to the second switch 225 and the second output 223. The second switch 225 is operable to make electrical connection between the first input 220 and the third switch 226 when D[1]=1, and to break electrical connection between the first input 220 and the third switch 226 when the D[1]=0. The third switch 226 is operable to make electrical connection between the second switch 225 and the second output 223 when D[0]=0, and to break electrical connection between the second switch 225 and the second output 223 when D[0]=1.

The fourth switch 227 is coupled to the second input 221 and the first output 222, and is operable to make electrical connection between the second input 221 and the first output 222 when D[1]=1, and to break electrical connection between the second input 221 and the first output 222 when D[1]=0.

The fifth switch 228 is coupled to the second input 221 and the second output 223, and is operable to make electrical connection between the second input 221 and the second output 223 when D[1]=0, and to break electrical connection between the second input 221 and the second output 223 when D[1]=1.

The sixth switch 229 is coupled across the fifth switch 228, and is operable to make electrical connection between the second input 221 and the second output 223 when D[0]=1, and to break electrical connection between the second input 221 and the second output 223 when D[0]=0.

As a result, the router unit 22 outputs the first voltage V0 as the first router voltage Vr0 and the second voltage V1 as the second router voltage Vr1 when D[1]=0, outputs the second voltage V1 as the first router voltage Vr0 and the first voltage V0 as the second router voltage Vr1 when D[1:0]=10, and outputs the second voltage V1 as both of the first and second router voltages Vr0, Vr1 when D[1:0]=11, as listed in Table 1.

The interpolation unit 23 includes a load 231 having first and second terminals 2311 and 2312, a first differential pair 232, a second differential pair 233, a variable current source 234, and an output stage 236.

The first differential pair 232 includes first and second transistors 2321 and 2322. The first transistor 2321 has a first terminal coupled to the first terminal 2311 of the load 231, a second terminal, and a control terminal for receiving the first router voltage Vr0. The second transistor 2322 has a first terminal coupled to the second terminal 2312 of the load 231, a second terminal coupled to the second terminal of the first transistor 2321, and a control terminal.

The second differential pair 233 includes third and fourth transistors 2331 and 2332. The third transistor 2331 has a first terminal coupled to the first terminal 2311 of the load 231, a second terminal, and a control terminal for receiving the second router voltage Vr1. The fourth transistor 2332 has a first terminal coupled to the second terminal 2312 of the load 231, a second terminal coupled to the second terminal of the third transistor 2331, and a control terminal.

The variable current source 234 receives the first bit of the digital signal D[0], and has a first terminal 2341 coupled to the second terminal of the first transistor 2321, and a second terminal 2342 coupled to the second terminal of the third transistor 2331. The variable current source 234 provides a first variable current at the first terminal 2341 thereof according to the first bit of the digital signal D[0], and provides a second variable current at the second terminal 2342 thereof according to the first bit of the digital signal D[0]. The variable current source 234 is configured such that a ratio of magnitudes between the first and second variable currents is (k+1):1 when D[0]=0, and such that the ratio of magnitudes between the first and second variable currents is k:2 when D[0]=1, where k is a predetermined positive non-zero number.

The output stage 236 has an input terminal coupled to the first terminal 2311 of the load 231, and an output terminal that is coupled to the control terminal of each of the second transistor 2322 and the fourth transistor 2332 and that provides the analog signal Vout according to voltage at the first terminal 2311 of the load 231.

Therefore, the interpolation unit 23 generates the analog signal Vout that satisfies a relationship of:

$$Vout = \frac{k+1}{k+2} \times Vr0 + \frac{1}{k+2} \times Vr1, \text{ when } D[0]=0$$

$$Vout = \frac{k}{k+2} \times Vr0 + \frac{2}{k+2} \times Vr1, \text{ when } D[0]=1$$

Table 1 lists the magnitudes of Vout when k=2.

Figure 5:
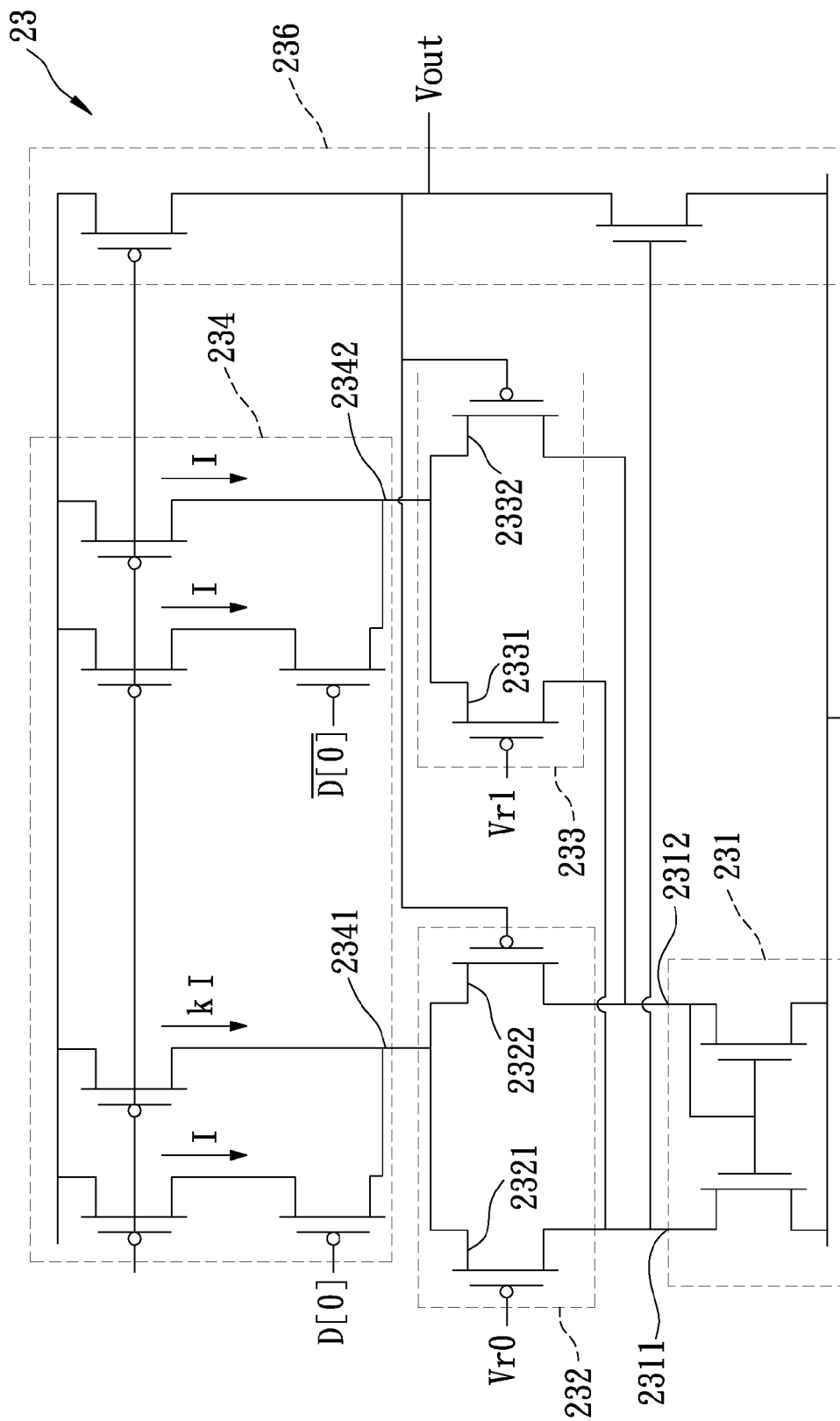
FIG. 5 is a schematic circuit diagram showing a second implementation of the interpolation unit of the first preferred embodiment.
Figure 6:
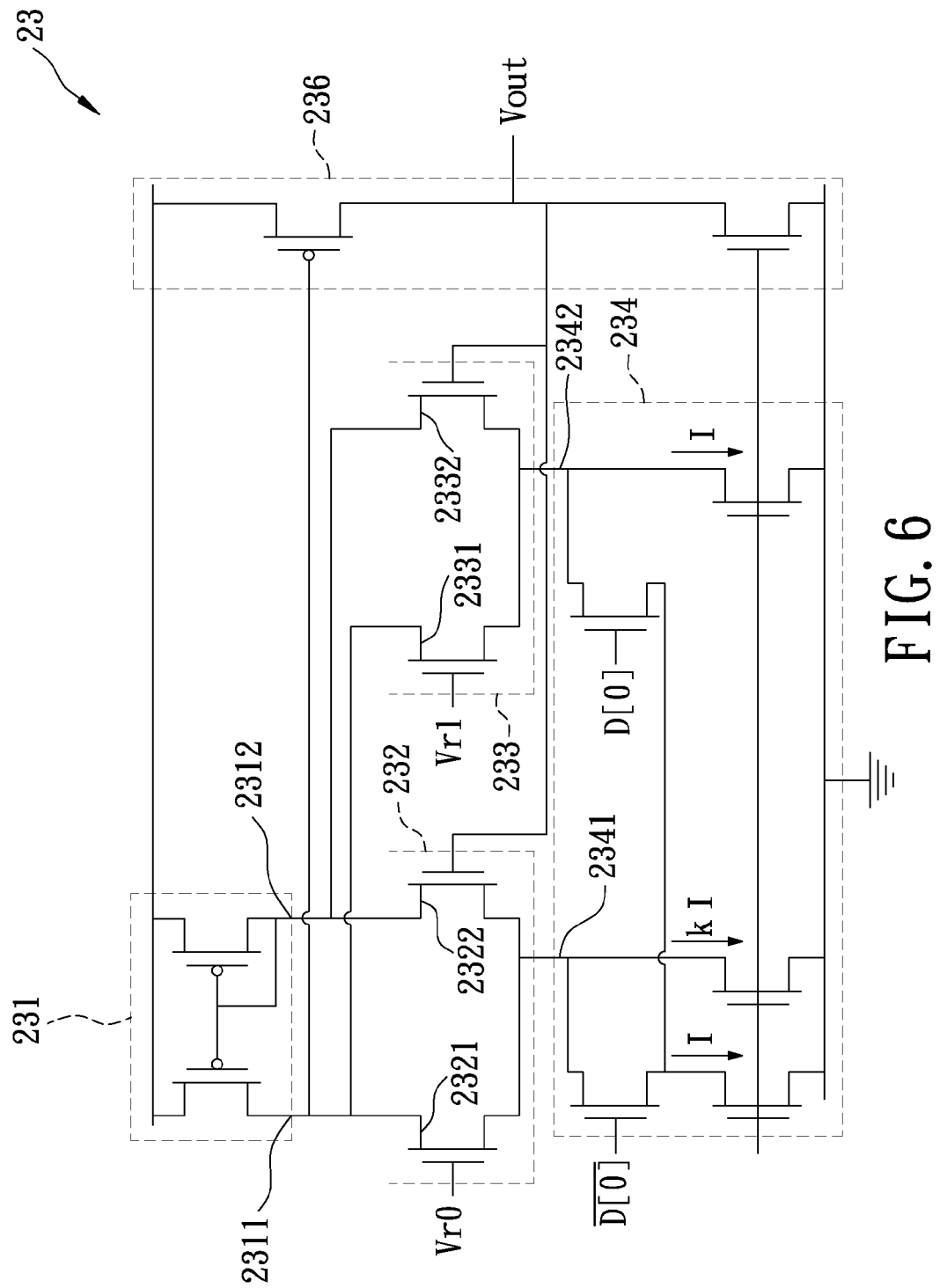
FIG. 6 is a schematic circuit diagram showing a third implementation of the interpolation unit of the first preferred embodiment.
Figure 7:
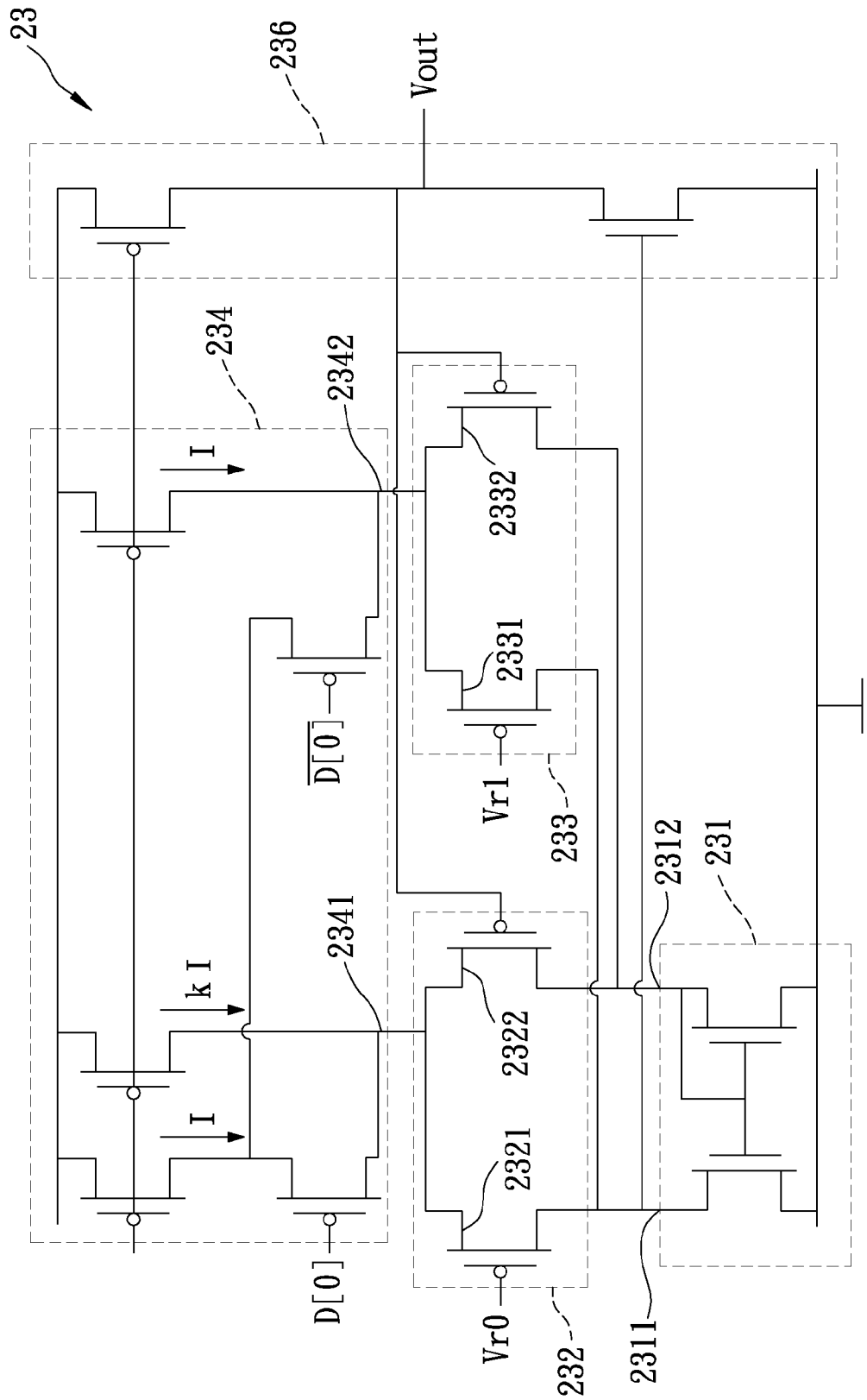
FIG. 7 is a schematic circuit diagram showing a fourth implementation of the interpolation unit of the first preferred embodiment.

FIGS. 4 to 7 show four implementations of the interpolation unit 23 according to this invention, respectively. In the interpolation unit 23, the load 231 may be implemented using P-type metal-oxide-semiconductor field-effect transistors (MOSFETs), the first differential pair 232, the second differential pair 233, and the variable current source may be implemented using N-type MOSFETs, and the output stage 236 may be implemented using complementary metal-oxide-semiconductor (CMOS) transistors, as shown in FIGS. 4 and 6. However, the load 231 may be implemented using N-type MOSFETs, the first differential pair 232, the second differential pair 233, and the variable current source may be implemented using P-type MOSFETs, and the output stage 236 may be implemented using CMOS transistors, as shown in FIGS. 5 and 7. The interpolation units 23 shown in FIGS. 4 and 6 differ in that the variable current sources 234 achieve the same function using different circuit designs. The interpolation units 23 shown in FIGS. 5 and 7 differ in that the variable current sources 234 achieve the same function using different circuit designs.

It should be noted that the actual value of k is not limited to be 2, and may be determined as required. For example, when the reference voltages Vref0~VrefM have an arithmetic progression relationship in magnitude, the value of k is selected to be 2 when a relationship between value of the digital signal D[5:0] and magnitude of the analog signal is expected to be linear. The value of k is selected to be not equal to 2 when the relationship between the digital signal D[5:0] and the analog signal is expected to be non-linear. Of course, in other embodiments, the reference voltages Vref0~VrefM may not have an arithmetic progression relationship in magnitude.

TABLE 1

| D[5:0] | V0 | V1 | Vr0 | Vr1 | Vout |
|---|---|---|---|---|---|
| 000000 | Vref0 | Vref1 | Vref0 | Vref1 | $\frac{3}{4}Vref0 + \frac{1}{4}Vref1$ |
| 000001 | Vref0 | Vref1 | Vref0 | Vref1 | $\frac{1}{2}Vref0 + \frac{1}{2}Vref1$ |
| 000010 | Vref0 | Vref1 | Vref1 | Vref0 | $\frac{1}{4}Vref0 + \frac{3}{4}Vref1$ |
| 000011 | Vref0 | Vref1 | Vref1 | Vref1 | Vref1 |
| 000100 | Vref1 | Vref2 | Vref1 | Vref2 | $\frac{3}{4}Vref1 + \frac{1}{4}Vref2$ |
| 000101 | Vref1 | Vref2 | Vref1 | Vref2 | $\frac{1}{2}Vref1 + \frac{1}{2}Vref2$ |
| 000110 | Vref1 | Vref2 | Vref2 | Vref1 | $\frac{1}{4}Vref1 + \frac{3}{4}Vref2$ |
| 000111 | Vref1 | Vref2 | Vref2 | Vref2 | Vref2 |
| 001000 | Vref2 | Vref3 | Vref2 | Vref3 | $\frac{3}{4}Vref2 + \frac{1}{4}Vref3$ |
| 001001 | Vref2 | Vref3 | Vref2 | Vref3 | $\frac{1}{2}Vref2 + \frac{1}{2}Vref3$ |
| 001010 | Vref2 | Vref3 | Vref3 | Vref2 | $\frac{1}{4}Vref2 + \frac{3}{4}Vref3$ |
| 001011 | Vref2 | Vref3 | Vref3 | Vref3 | Vref3 |
| . | . | . | . | . | . |
| . | . | . | . | . | . |
| . | . | . | . | . | . |
| 111100 | Vref15 | Vref16 | Vref15 | Vref16 | $\frac{3}{4}Vref15 + \frac{1}{4}Vref16$ |
| 111101 | Vref15 | Vref16 | Vref15 | Vref16 | $\frac{1}{2}Vref15 + \frac{1}{2}Vref16$ |
| 111110 | Vref15 | Vref16 | Vref16 | Vref15 | $\frac{1}{4}Vref15 + \frac{3}{4}Vref16$ |
| 111111 | Vref15 | Vref16 | Vref16 | Vref16 | Vref16 |

Figure 1:
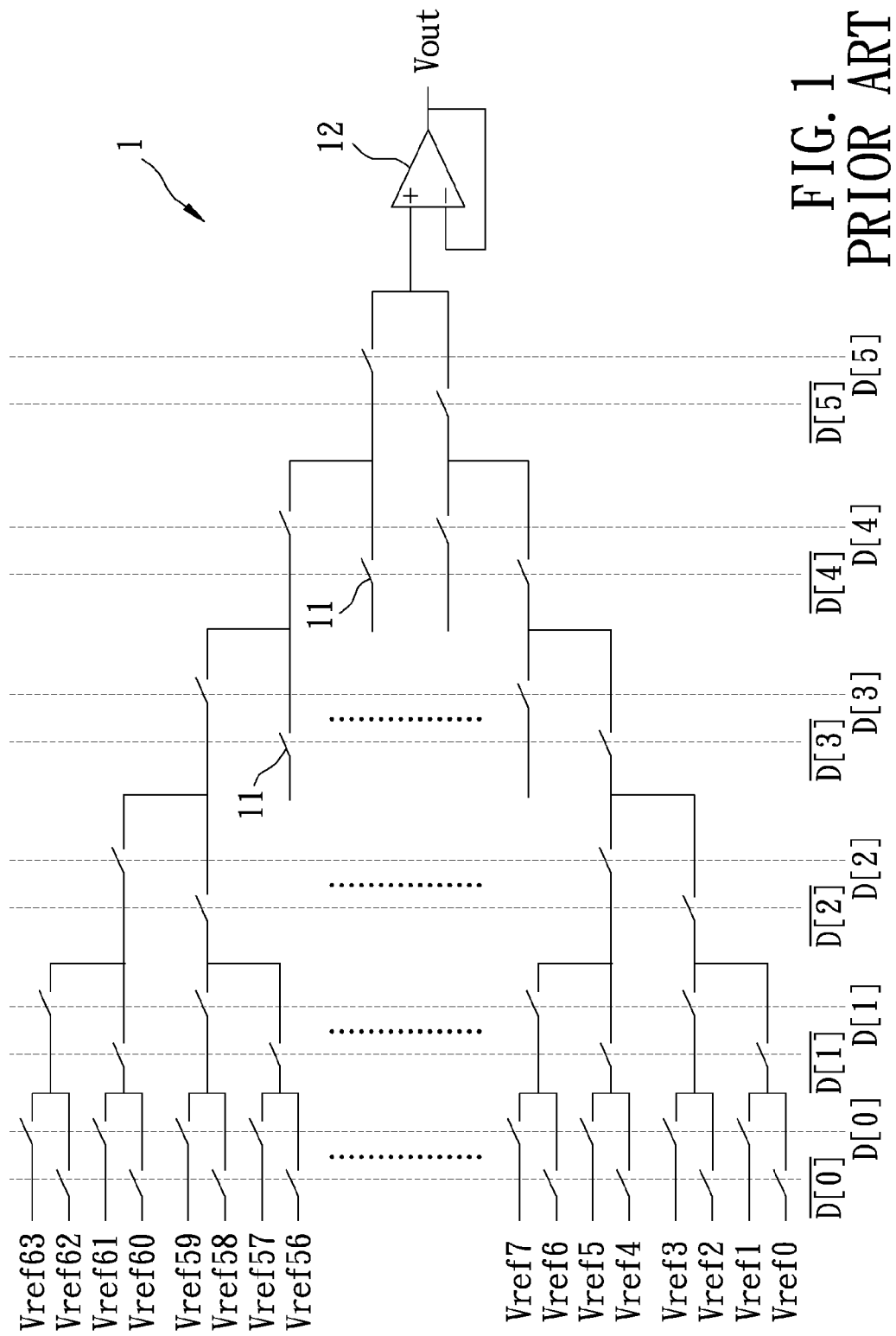
FIG. 1 is a schematic circuit diagram showing a conventional 6-bit digital-to-analog converter.

In this embodiment, the interpolative D/A converter 2 employs a smaller number of the switches 221, 224229 when N is sufficiently large, resulting in easier routing and a smaller area occupied by the switches and routing. For example, the interpolative D/A converter 2 of this embodiment employs 46 switches 211, 224229 when N=6, while the conventional 6-bit D/A converter (as shown in FIG. 1) employs 126 switches 11.

It should be noted that the first preferred embodiment may be modified to be adapted for use under a condition of N=2. In this case, the interpolative D/A converter 2 does not include the multiplexer unit 21, while the first voltage V0 is the first reference voltage Vref0, and the second voltage V1 is the second reference voltage Vref1.

Figure 8:
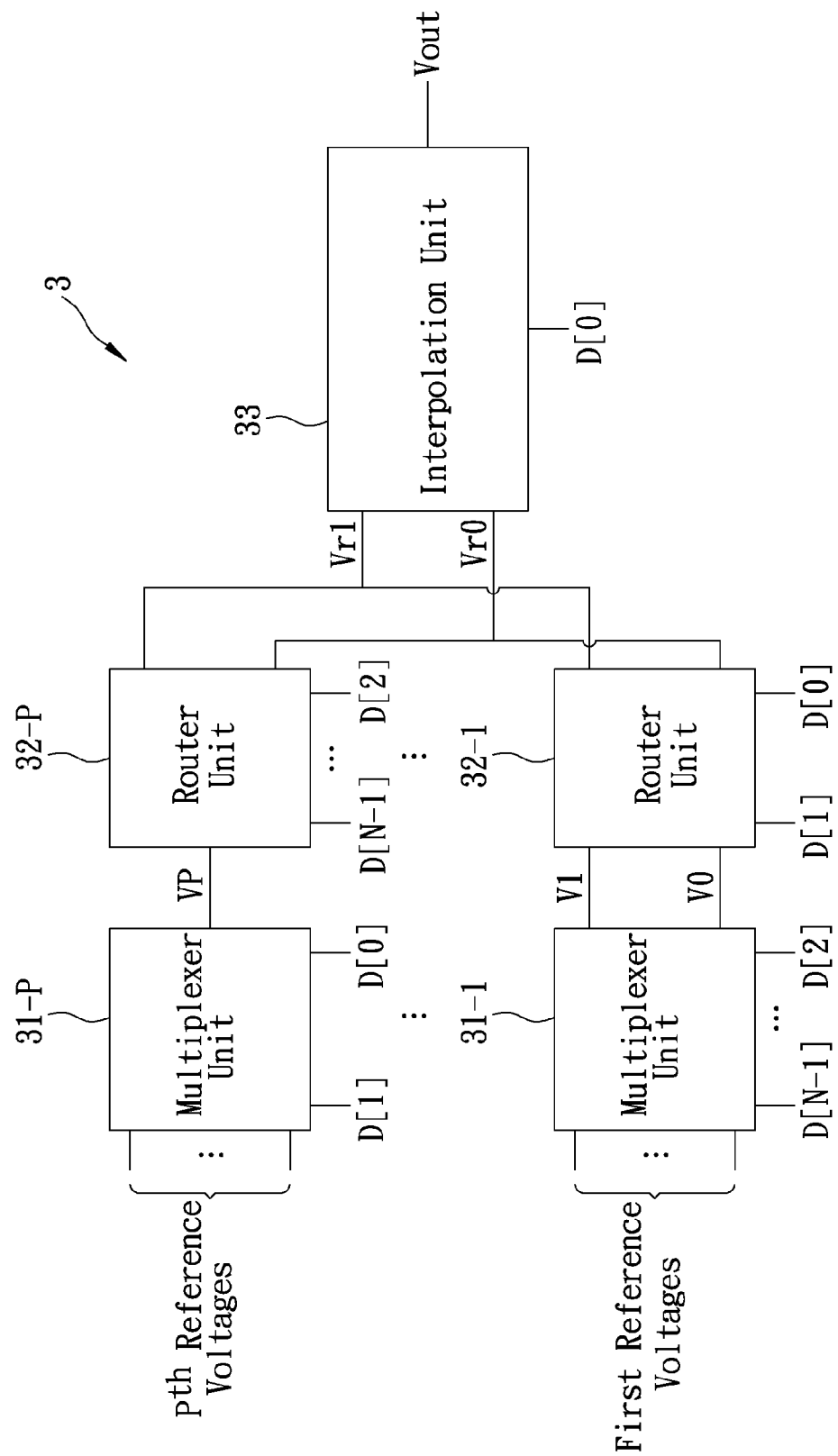
FIG. 8 is a block diagram showing a second preferred embodiment of the interpolative digital-to-analog converter according to the present invention.

Referring to FIG. 8, a second preferred embodiment of the interpolative D/A converter 3 according to this invention is shown to be adapted to convert a digital signal D[N−1:0] that includes $1^{st}$ to $N^{th}$ bits D[0]~D[N−1] into an analog signal Vout, where N is a positive integer greater than 2. The interpolative D/A converter 3 includes P multiplexer units 31-1~31-P, P router units 32-1~32-P, and an interpolation unit 33, where P is a positive integer greater than 1.

The multiplexer unit 31-1 receives the third to the $N^{th}$ bits of the digital signal D[2]~D[N−1] and a plurality of reference voltages with different magnitudes. The multiplexer unit 31-1 outputs two of the reference voltages as first and second voltages V0, V1, respectively, or does not output the first and second voltages V0, V1 according to the $3^{rd}$ to $N^{th}$ bits of the digital signal D[2]~D[N−1].

Each of the other multiplexer units 31-2~31-P receives the first and second bits of the digital signal D[0], D[1] and a plurality of reference voltages with different magnitudes, and outputs one of the reference voltages as a $J+1^{th}$ voltage VJ according to the first and second bits of the digital signal D[0], D[1], where J is a positive integer ranging from 2 to P and corresponds to the reference numeral of the respective multiplexer unit 31-2~31-P.

The router unit 32-1 is coupled to the multiplexer unit 31-1 for receiving the first and second voltages V0, V1 therefrom and receives the first and second bits of the digital signal D[0], D[1]. The router unit 32-1 outputs one of the first and second voltages V0, V1 to be a first router voltage Vr0 and outputs one of the first and second voltages V0, V1 to be a second router voltage Vr1 based on the first and second bits of the digital signal D[0], D[1].

Each of the other router units 32-2~32-P is coupled to a corresponding one of the multiplexer units 31-2~31-P for receiving the $J+1^{th}$ voltage VJ therefrom, and receives the third to $N^{th}$ bits of the digital signal D[2]~D[N−1]. Each of the these router units 32-2~32-P determines whether or not to output the $J+1^{th}$ voltage VJ to be both of the first and second router voltages Vr0, Vr1 according to the third to $N^{th}$ bits of the digital signal D[2]~D[N−1].

The interpolation unit 33 receives the first bit of the digital signal D[0], and is coupled to the router units 32-1~32-P for receiving the first and second router voltages Vr0, Vr1. The interpolation unit 33 performs interpolation operation on the first and second router voltages Vr0, Vr1 according to the first bit of the digital signal D[0], so as to generate the analog signal Vout having a voltage magnitude ranging from the first router voltage Vr0 to the second router voltage Vr1.

Figure 9:
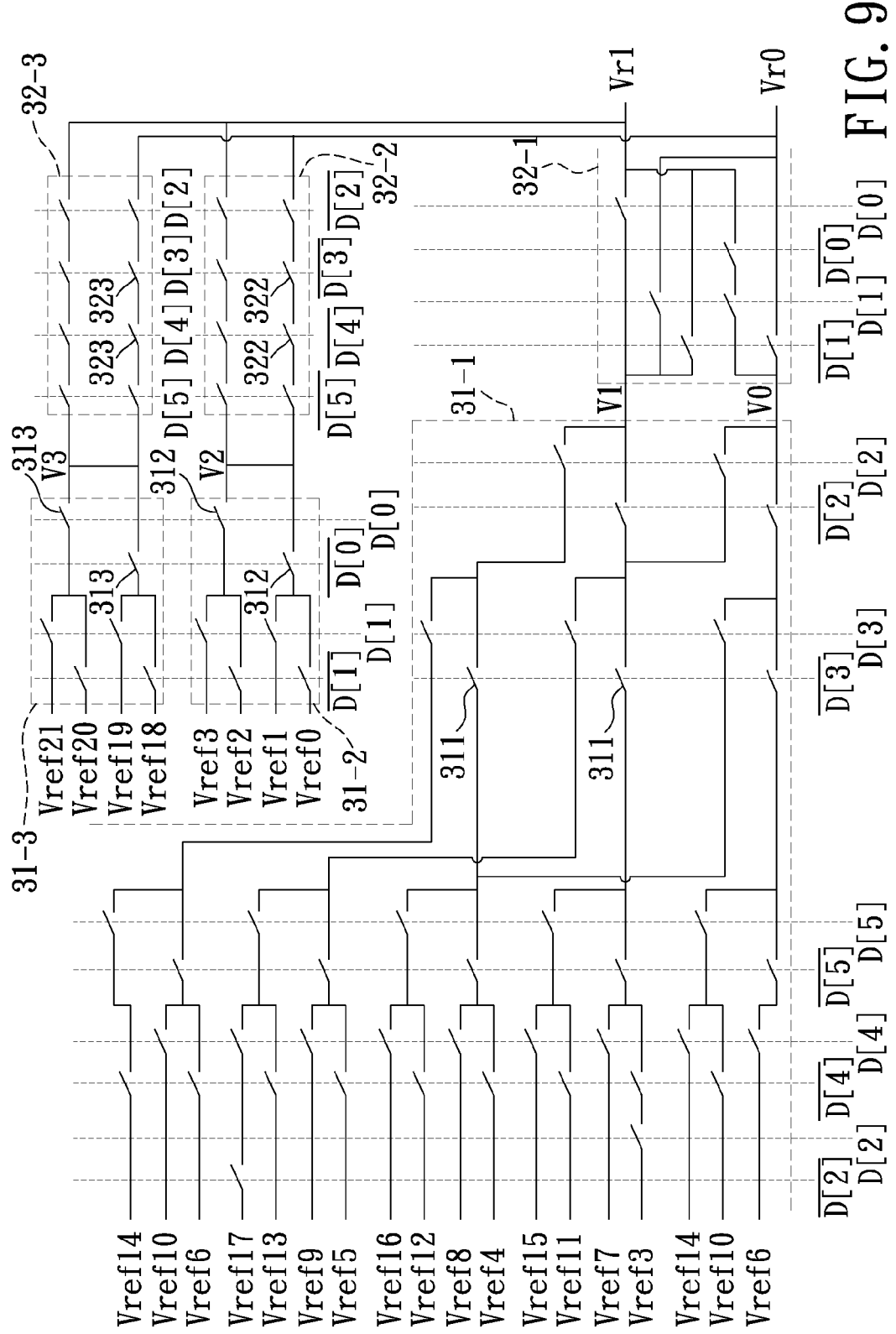
FIG. 9 is a schematic circuit diagram showing three multiplexer units and three router units of the second preferred embodiment.

Referring to FIGS. 8 and 9, the following illustrations are exemplified using N=6 and P=3.

The multiplexer unit 31-1 includes forty switches 311, and receives fifteen reference voltages Vref3~Vref17 having an arithmetic progression relationship in magnitude. In FIG. 9, the switches 311 corresponding to D[*] do not conduct when D[*]=0, and conduct when D[*]=1. The switches 311 corresponding to $\overline{D[*]}$ conduct when D[*]=0, and do not conduct when D[*]=1. Therefore, the multiplexer unit 31-1 does not output the first and second voltages V0, V1 when D[5:2]= 0000 or 1111, and outputs V0=Vref3 and V1=Vref4 when D[5:2]=0001, V0=Vref4 and V1=Vref5 when D[5:2]= 0010, . . . , V0=Vref16 and V1=Vref17 when D[5:2]=1110, as listed in Table 2.

The multiplexer unit 31-2 includes six switches 312, and receives four reference voltages Vref0~Vref3 having an arithmetic progression relationship in magnitude. In FIG. 9, the switches 312 corresponding to D[*] do not conduct when D[*]=0, and conduct when D[*]=1. The switches 312 corresponding to $\overline{D[*]}$ conduct when D[*]=0, and do not conduct when D[*]=1. Therefore, the multiplexer unit 31-2 outputs V2=Vref0 when D[1:0]=00, V2=Vref1 when D[1:0]=01, V2=Vref2 when D[1:0]=10, and V2=Vref3 when D[1:0]=11, as listed in Table 2.

The multiplexer unit 31-3 includes six switches 313, and receives four reference voltages Vref18~Vref21 having an arithmetic progression relationship in magnitude. In FIG. 9, the switches 313 corresponding to D[*] do not conduct when D[*]=0, and conduct when D[*]=1. The switches 313 corresponding to $\overline{D[*]}$ conduct when D[*]=0, and do not conduct when D[*]=1. Therefore, the multiplexer unit 31-3 outputs V3=Vref18 when D[1:0]=00, V3=Vref19 when D[1:0]=01, V3=Vref20 when D[1:0]=10, and V3=Vref21 when D[1:0]=11, as listed in Table 2.

The router unit 32-1 has the same configuration as the router unit 22 of the first preferred embodiment, as shown in FIG. 3, and details thereof are not repeated herein. Outputs of the first and second router voltages Vr0 and Vr1 by the router unit 32-1 when D[5:2]=0001~1110 are listed in Table 2.

The router unit 32-2 includes eight switches 322. In FIG. 9, the switches 322 corresponding to $\overline{D[*]}$ conduct when D[*]=0, and do not conduct when D[*]=1. Therefore, the router unit 32-2 outputs Vr0=V2 and Vr1=V2 when D[5:2]=0000, and does not output the first and second router voltages when D[5:2] has any other value, as listed in Table 2.

The router unit 32-3 includes eight switches 323. In FIG. 9, the switches 323 corresponding to D[*] do not conduct when D[*]=0, and conduct when D[*]=1. Therefore, the router unit 32-3 outputs Vr0=V3 and Vr1=V3 when D[5:2]=1111, and does not output the first and second router voltages when D[5:2] has any other value, as listed in Table 2.

The interpolation unit 33 has the same configuration as the interpolation unit 23 of the first preferred embodiment, as shown in FIGS. 4 to 7, and details thereof are not repeated herein. Output of the analog signal Vout by the interpolation unit 33 is listed in Table 2, where k=2 in this embodiment.

TABLE 2

| D[5:0] | V0 | V1 | V2 | V3 | Vr0 | Vr1 | Vout |
|---|---|---|---|---|---|---|---|
| 000000 | — | — | Vref0 | Vref18 | Vref0 | Vref0 | Vref0 |
| 000001 | — | — | Vref1 | Vref19 | Vref1 | Vref1 | Vref1 |
| 000010 | X | X | Vref2 | Vref20 | Vref2 | Vref2 | Vref2 |
| 000011 | X | X | Vref3 | Vref21 | Vref3 | Vref3 | Vref3 |
| 000100 | Vref3 | Vref4 | Vref0 | Vref18 | Vref3 | Vref4 | $\frac{3}{4}$Vref3 + $\frac{1}{4}$Vref4 |
| 000101 | Vref3 | Vref4 | Vref1 | Vref19 | Vref3 | Vref4 | $\frac{1}{2}$Vref3 + $\frac{1}{2}$Vref4 |
| 000110 | Vref3 | Vref4 | Vref2 | Vref20 | Vref4 | Vref3 | $\frac{1}{4}$Vref3 + $\frac{3}{4}$Vref4 |
| 000111 | Vref3 | Vref4 | Vref3 | Vref21 | Vref4 | Vref4 | Vref4 |
| 001000 | Vref4 | Vref5 | Vref0 | Vref18 | Vref4 | Vref5 | $\frac{3}{4}$Vref4 + $\frac{1}{4}$Vref5 |
| 001001 | Vref4 | Vref5 | Vref1 | Vref19 | Vref4 | Vref5 | $\frac{1}{2}$Vref4 + $\frac{1}{2}$Vref5 |
| 001010 | Vref4 | Vref5 | Vref2 | Vref20 | Vref5 | Vref4 | $\frac{1}{4}$Vref4 + $\frac{3}{4}$Vref5 |
| 001011 | Vref4 | Vref5 | Vref3 | Vref21 | Vref5 | Vref5 | Vref5 |
| . | . | . | . | . | . | . | . |
| . | . | . | . | . | . | . | . |
| . | . | . | . | . | . | . | . |
| 111000 | Vref16 | Vref17 | Vref0 | Vref18 | Vref16 | Vref17 | $\frac{3}{4}$Vref16 + $\frac{1}{4}$Vref17 |
| 111001 | Vref16 | Vref17 | Vref1 | Vref19 | Vref16 | Vref17 | $\frac{1}{2}$Vref16 + $\frac{1}{2}$Vref17 |
| 111010 | Vref16 | Vref17 | Vref2 | Vref20 | Vref17 | Vref16 | $\frac{1}{4}$Vref16 + $\frac{3}{4}$Vref17 |
| 111011 | Vref16 | Vref17 | Vref3 | Vref21 | Vref17 | Vref17 | Vref17 |
| 111100 | — | — | Vref0 | Vref18 | Vref18 | Vref18 | Vref18 |
| 111101 | — | — | Vref1 | Vref19 | Vref19 | Vref19 | Vref19 |
| 111110 | — | — | Vref2 | Vref20 | Vref20 | Vref20 | Vref20 |
| 111111 | — | — | Vref3 | Vref21 | Vref21 | Vref21 | Vref21 |

It should be noted that, when the ratio among the common differences of the reference voltages Vref0~Vref3, Vref3~Vref17, and Vref17~Vref21 is 1:4:1, the relationship between value of the digital signal D[5:0] and magnitude of the analog signal is linear.

In this embodiment, the interpolative D/A converter 3 employs a smaller number of the switches when N is sufficient large by virtue of the router units 32-1~32-3 and the interpolation unit 33, resulting in easier routing and smaller area occupied by the switches and routing. For example, the interpolative D/A converter 3 of this embodiment employs 74 switches (in the multiplexer units 31-1~31-3 and the router units 32-1~32-3) when N=6, while the conventional 6-bit D/A converter 1 (as shown in FIG. 1) employs 126 switches 11.

Figure 10:
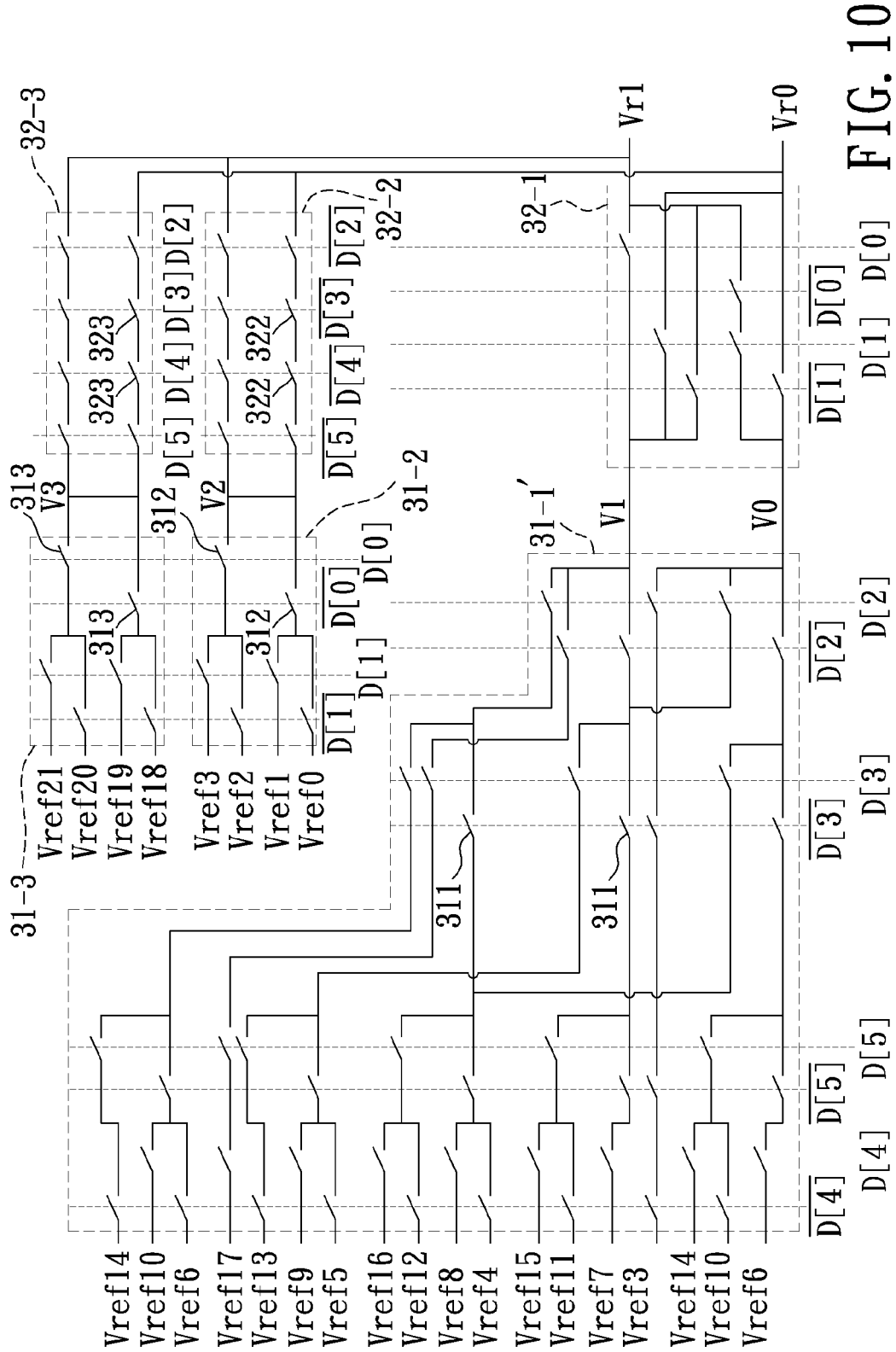
FIG. 10 is a schematic circuit diagram showing three multiplexer units and three router units of a third preferred embodiment of the interpolative digital-to-analog converter according to the present invention.

Referring to FIG. 10, a third preferred embodiment of the interpolative D/A converter according to this invention is shown to be similar to the second preferred embodiment. The difference resides in that the multiplexer unit 31-1' uses a different circuit design to achieve the same function. The following illustration is exemplified using N=6 and P=3.

The multiplexer unit 31-1' of this embodiment includes forty-four switches 311. Conductions of six of the forty-four switches 311 are controlled using the third bit of the digital signal D[2], conductions of eight of the forty-four switches 311 are controlled using the fourth bit of the digital signal D[3], conductions of eighteen of the forty-four switches 311 are controlled using the fifth bit of the digital signal D[4], and conductions of twelve of the forty-four switches 311 are controlled using the sixth bit of the digital signal D[5]. On the other hand, the multiplexer unit 31-1 of the second preferred embodiment (as shown in FIG. 9) includes forty switches 311. Conductions of six of the forty switches 311 are controlled using the third bit of the digital signal D[2], conductions of six of the forty switches 311 are controlled using the fourth bit of the digital signal D[3], conductions of eighteen of the forty switches 311 are controlled using the fifth bit of the digital signal D[4], and conductions of ten of the forty switches 311 are controlled using the sixth bit of the digital signal D[5].

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An interpolative digital-to-analog converter adapted to convert a digital signal that includes first to $N^{th}$ bits into an analog signal, where N is a positive integer greater than 1, said interpolative digital-to-analog converter comprising:
    a first router unit that is adapted to receive the first and second bits of the digital signal, and first and second voltages, and that is operable based on the first and second bits of the digital signal to output one of the first and second voltages to be a first router voltage and to output one of the first and second voltages to be a second router voltage; and
    an interpolation unit that receives the first bit of the digital signal, that is coupled to said first router unit for receiving the first and second router voltages, and that is operable to perform interpolation operation on the first and second router voltages according to the first bit of the digital signal, so as to generate the analog signal having a voltage magnitude ranging from the first router voltage to the second router voltage.

2. The interpolative digital-to-analog converter as claimed in claim 1, wherein said first router unit is configured to output the first voltage as the first router voltage and the second voltage as the second router voltage when the second bit of the digital signal has a first logic value, to output the second voltage as the first router voltage and the first voltage as the second router voltage when the first bit of the digital signal has the first logic value and the second bit of the digital signal has a second logic value, and to output the second voltage as both of the first and second router voltages when each of the first and second bits of the digital signal has the second logic value.

3. The interpolative digital-to-analog converter as claimed in claim 2, wherein said first router unit includes:
    a first input for receiving the first voltage;
    a second input for receiving the second voltage;
    a first output for outputting the first router voltage;
    a second output for outputting the second router voltage;
    a first switch coupled to said first input and said first output, and operable to make electrical connection between said first input and said first output when the second bit of the digital signal has the first logic value, and to break electrical connection between said first input and said first output when the second bit of the digital signal has the second logic value;
    a second switch coupled to said first input, and a third switch coupled to said second switch and said second output, said second switch being operable to make electrical connection between said first input and said third switch when the second bit of the digital signal has the second logic value, and to break electrical connection between said first input and said third switch when the second bit of the digital signal has the first logic value, said third switch being operable to make electrical connection between said second switch and said second output when the first bit of the digital signal has the first logic value, and to break electrical connection between said second switch and said second output when the first bit of the digital signal has the second logic value;
    a fourth switch coupled to said second input and said first output, and operable to make electrical connection between said second input and said first output when the second bit of the digital signal has the second logic value, and to break electrical connection between said second input and said first output when the second bit of the digital signal has the first logic value;
    a fifth switch coupled to said second input and said second output, and operable to make electrical connection between said second input and said second output when the second bit of the digital signal has the first logic value, and to break electrical connection between said second input and said second output when the second bit of the digital signal has the second logic value; and
    a sixth switch coupled across said fifth switch, and operable to make electrical connection between said second input and said second output when the first bit of the digital signal has the second logic value, and to break electrical connection between said second input and said second output when the first bit of the digital signal has the first logic value.

4. The interpolative digital-to-analog converter as claimed in claim 3, wherein said interpolation unit is configured such that the analog signal satisfies a relationship of:

$$Vout = \frac{k+1}{k+2} \times Vr0 + \frac{1}{k+2} \times Vr1, \text{ when } D[0] = L0$$

$$Vout = \frac{k}{k+2} \times Vr0 + \frac{2}{k+2} \times Vr1, \text{ when } D[0] = L1$$

where Vout is a voltage magnitude of the analog signal, Vr0 is a magnitude of the first router voltage, Vr1 is a magnitude of the second router voltage, D[0] is a logic value of the first bit of the digital signal, L0 is the first logic value, L1 is the second logic value, and k is a predetermined positive non-zero number.

5. The interpolative digital-to-analog converter as claimed in claim 4, wherein said interpolation unit includes:
   a load having first and second terminals;
   a first differential pair including first and second transistors, said first transistor having a first terminal coupled to said first terminal of said load, a second terminal, and a control terminal for receiving the first router voltage, said second transistor having a first terminal coupled to said second terminal of said load, a second terminal coupled to said second terminal of said first transistor, and a control terminal;
   a second differential pair including third and fourth transistors, said third transistor having a first terminal coupled to said first terminal of said load, a second terminal, and a control terminal for receiving the second router voltage, said fourth transistor having a first terminal coupled to said second terminal of said load, a second terminal coupled to said second terminal of said third transistor, and a control terminal;
   a variable current source disposed to receive the first bit of the digital signal, said variable current source having a first terminal coupled to said second terminal of said first transistor, and a second terminal coupled to said second terminal of said third transistor, and being operable to provide a first variable current at said first terminal thereof according to the first bit of the digital signal, and to provide a second variable current at said second terminal thereof according to the first bit of the digital signal, said variable current source being configured such that a ratio of magnitudes between the first and second variable currents is (k+1):1 when the first bit of the digital signal has the first logic value, and such that the ratio of magnitudes between the first and second variable currents is k:2 when the first bit of the digital signal has the second logic value; and
   an output stage having an input terminal coupled to said first terminal of said load, and an output terminal that is coupled to said control terminal of each of said second transistor and said fourth transistor and that provides the analog signal according to voltage at said first terminal of said load.

6. The interpolative digital-to-analog converter as claimed in claim 2, wherein said interpolation unit is configured such that the analog signal satisfies a relationship of:

$$Vout = \frac{k+1}{k+2} \times Vr0 + \frac{1}{k+2} \times Vr1, \text{ when } D[0] = L0$$
$$Vout = \frac{k}{k+2} \times Vr0 + \frac{2}{k+2} \times Vr1, \text{ when } D[0] = L1$$

where Vout is a voltage magnitude of the analog signal, Vr0 is a magnitude of the first router voltage, Vr1 is a magnitude of the second router voltage, D[0] is a logic value of the first bit of the digital signal, L0 is the first logic value, L1 is the second logic value, and k is a predetermined positive non-zero number.

7. The interpolative digital-to-analog converter as claimed in claim 6, wherein said interpolation unit includes:
   a load having first and second terminals;
   a first differential pair including first and second transistors, said first transistor having a first terminal coupled to said first terminal of said load, a second terminal, and a control terminal for receiving the first router voltage, said second transistor having a first terminal coupled to said second terminal of said load, a second terminal coupled to said second terminal of said first transistor, and a control terminal;
   a second differential pair including third and fourth transistors, said third transistor having a first terminal coupled to said first terminal of said load, a second terminal, and a control terminal for receiving the second router voltage, said fourth transistor having a first terminal coupled to said second terminal of said load, a second terminal coupled to said second terminal of said third transistor, and a control terminal;
   a variable current source disposed to receive the first bit of the digital signal, said variable current source having a first terminal coupled to said second terminal of said first transistor, and a second terminal coupled to said second terminal of said third transistor, and being operable to provide a first variable current at said first terminal thereof according to the first bit of the digital signal, and to provide a second variable current at said second terminal thereof according to the first bit of the digital signal, said variable current source being configured such that a ratio of magnitudes between the first and second variable currents is (k+1):1 when the first bit of the digital signal has the first logic value, and such that the ratio of magnitudes between the first and second variable currents is k:2 when the first bit of the digital signal has the second logic value; and
   an output stage having an input terminal coupled to said first terminal of said load, and an output terminal that is coupled to said control terminal of each of said second transistor and said fourth transistor and that provides the analog signal according to voltage at said first terminal of said load.

8. The interpolative digital-to-analog converter as claimed in claim 1, where N is greater than 2, said interpolative digital-to-analog converter further comprising a first multiplexer unit disposed to receive the third to the $N^{th}$ bits of the digital signal and a plurality of first reference voltages with different magnitudes, and operable to output two of the first reference voltages as the first and second voltages, respectively, according to the third to the $N^{th}$ bits of the digital signal, said first router unit being further coupled to said first multiplexer unit for receiving the first and second voltages therefrom.

9. The interpolative digital-to-analog converter as claimed in claim 8, further comprising:
   a second multiplexer unit disposed to receive the first and second bits of the digital signal and a plurality of second reference voltages with different magnitudes, and operable to output one of the second reference voltages as a third voltage according to the first and second bits of the digital signal; and
   a second router unit that receives the third to $N^{th}$ bits of the digital signal, that is coupled to said second multiplexer unit for receiving the third voltage therefrom, and that is coupled to said interpolation unit, said second router unit being operable to determine whether or not to output the third voltage to be both of the first and second router voltages according to the third to Nth bits of the digital signal;

wherein said first multiplexer unit is configured not to output the first and second voltages to said first router unit when said second router unit outputs the third voltage to be both of the first and second router voltages.

* * * * *